US006169408B1

(12) United States Patent
Kantor et al.

(10) Patent No.: US 6,169,408 B1
(45) Date of Patent: *Jan. 2, 2001

(54) METHOD AND APPARATUS FOR TESTING AN INTEGRATED CIRCUIT WITH A PULSED RADIATION BEAM

(75) Inventors: Kenneth J. Kantor, Cedar Park; Kent B. Erington; John E. Asquith, both of Austin, all of TX (US)

(73) Assignee: Motorola, Inc., Schaumburg, IL (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/723,033

(22) Filed: Sep. 30, 1996

(51) Int. Cl.⁷ .................................................. G01R 19/00
(52) U.S. Cl. ............................................ 324/752; 324/96
(58) Field of Search ..................... 324/765, 752, 324/750, 751, 767; 250/310, 311; 364/579; 356/400, 401; 702/28, 40

(56) References Cited

U.S. PATENT DOCUMENTS

| 4,588,950 | 5/1986 | Henley .............................. 324/158 R |
| 4,761,607 | * 8/1988 | Shiragasawa et al. ................ 324/752 |
| 5,126,660 | * 6/1992 | Harvey et al. .......................... 324/96 |
| 5,334,540 | 8/1994 | Ishii ......................................... 437/7 |
| 5,430,305 | 7/1995 | Cole, Jr. ........................... 250/559.07 |
| 5,451,863 | * 9/1995 | Freeman ............................... 324/750 |

OTHER PUBLICATIONS

Sawyer, David E. et al., Laser Scanning of MOS IC's Reveals Internal Logic States Nondestructively, Proceedings of the IEEE, Mar. 1976, pp. 393–394.

Pronobis, Mark T. et al., "Laser Die Proving for Complex CMOS," from Conference Proceedings, International Symposium for Testing and Failure Analysis (ISTFA), 1982, pp. 178–181. (Month Unavailable).

Henley, F. J., "An Automated Laser Prover to Determine VLSI Internal Node Logic States," 1984 International Test Conference, IEEE, Paper 17.1, pp. 536–542. (Month Unavailable).

Ziegler, E. et al., "IC Testing Using Optical Beam Induced Currents Generated by A Laser Scan Microscope," Microeletronic Engineering 7, 1987, pp. 309–315. (Month Unavailable).

* cited by examiner

Primary Examiner—Vinh P. Nguyen

(57) ABSTRACT

Amplitude modulated optical beam induced current (AMOBIC) created by irradiating an internal PN junction of an integrated circuit (IC) (20) is used to determine a voltage level of the internal PN junction. In one embodiment, an IC (20) requiring high current and operating above the kilo-Hertz frequency range is monitored using a pulsed infrared laser beam (42). An AMOBIC signal is created when an internal PN junction is irradiated with the pulsed infrared laser beam (42). By using a pulsed infrared laser beam (42) an OBIC signal is amplitude modulated (AM) to a carrier frequency. This carrier frequency is selected so that the AMOBIC signal is large when compared to the various noise sources present at or near the carrier frequency. The noise rejection resulting from frequency shifting of the OBIC perturbation is further increased by selectively attenuating transient current spikes occurring at IC clock edges, whereby IC testing is further improved.

34 Claims, 6 Drawing Sheets

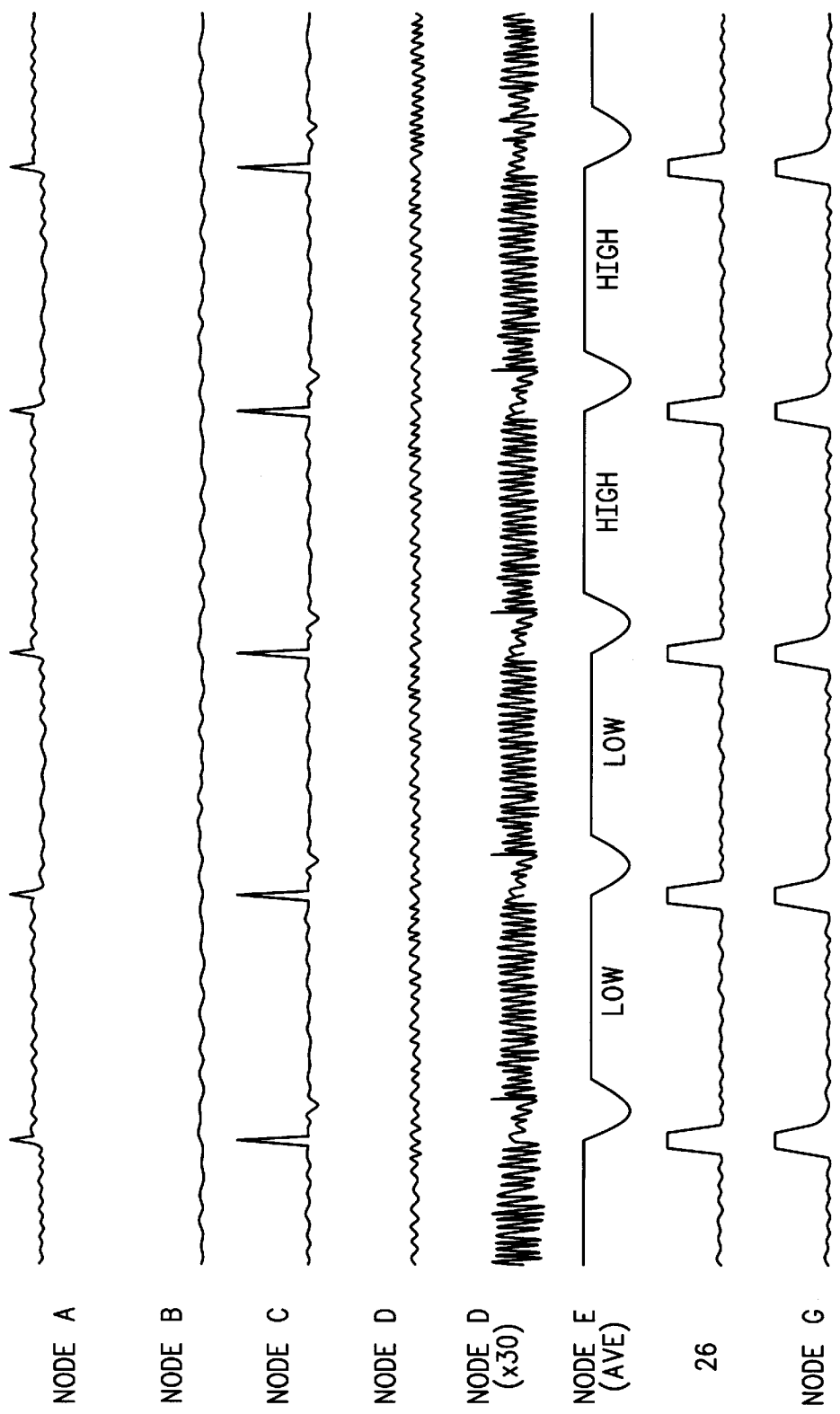

METHOD AND APPARATUS FOR TESTING AN INTEGRATED CIRCUIT WITH A PULSED RADIATION BEAM

FIELD OF THE INVENTION

The present invention relates generally to integrated circuits, and more generally to a method and apparatus for testing integrated circuits.

BACKGROUND OF THE INVENTION

It is highly desirable to monitor the internal electrical characteristics of packaged integrated circuits (ICs) to ensure proper functionality, and to identify internal manufacturing or design defects. One technique used to monitor the electrical characteristics of ICs is to create an optical beam induced current (OBIC) within a packaged IC by irradiating a point within it with a constant-energy laser. The small OBIC perturbations caused within the IC by the laser are then monitored on an external pin of the IC. In one prior art technique, OBIC is used to monitor the IC while it is in a static mode (the circuit nodes within the IC are not transitioning and a clock signal is not being dynamically provided to the IC). More specifically, the internal clock of the IC is stopped while it is scanned with the laser so that the extreme noise introduced by the switching of the IC's clock is avoided. Typical clock noise and VDD/ground rail currents may be on the order of several hundred milliamperes with fluctuations of several hundred milliamperes. The OBIC signal induced by the laser is typically 1 microampere or less, and thus it is easily lost in the noise which is also present at the external pin of the IC. A critical limitation of the static OBIC technique is that it is not applicable to a class of non-static ICs which require the clock to be applied continuously for the IC to remain in a functional state. The static technique of OBIC measurement also has limited utility because the integrated circuit is only observed while in a single static state, whereas a typical IC test sequence involves hundreds of sequential states that must be monitored to diagnose the IC. In addition, static OBIC techniques do not enable measurement of transient information. Therefore, by not being able to view dynamic operations, a great deal of diagnostic information is lost when using the static OBIC technique.

In a related technique, the IC is run at a higher frequency of operation without irradiation of the laser up to a certain point in time. At the certain point in time, the internal clock of the integrated circuit is momentarily stopped so that a single measurement of a given circuit node within the IC can be made using the constant-energy laser. Thus, this technique is a pseudo-dynamic technique but still only measures static conditions after dynamic operation. This pseudo-dynamic technique is subject to the same limitations of a static technique described above.

A third technique employs a single sample, DC OBIC subtraction circuit to demonstrate dynamic measurements at slow clock speeds. This technique is inherently sensitive to IDD transients and overall test system noise especially at higher IC operating frequencies, and thus, is limited to frequencies of roughly 100 hertz (Hz) or lower. Given that nearly all modern ICs operate at speeds in excess of 10 MHz, testing at 100 Hz is disadvantageous. This 100 Hz test is analogous to testing a 200 mph stock car at 0.002 mph to see if the car runs properly. Clearly, a higher frequency test methodology would be advantageous.

Furthermore, this technique is also current limited whereby only integrated circuits which draw less than about two milliamperes can be tested. Almost all high-powered modern integrated circuits now draw in excess of two milliamperes, thereby rendering this technique much less valuable.

Accordingly, a need exists for a method of monitoring the internal electrical characteristics of an integrated circuit where (1) higher test frequencies are obtained; (2) better noise rejection for measuring OBIC signal is achieved; (3) higher current and higher powered ICs (on the order of hundreds of milliamperes) can be tested in an OBIC manner; (4) dynamic logic transitions between logic low and logic high can be observed rather than static logic states; and (5) analog voltage variations can be detected rather than just logic 1 or logic 0 static digital states.

BRIEF DESCRIPTION OF THE DRAWINGS

FIG. 10 illustrates voltage waveforms for various circuit nodes in detection circuitry 38.

Figure 1:
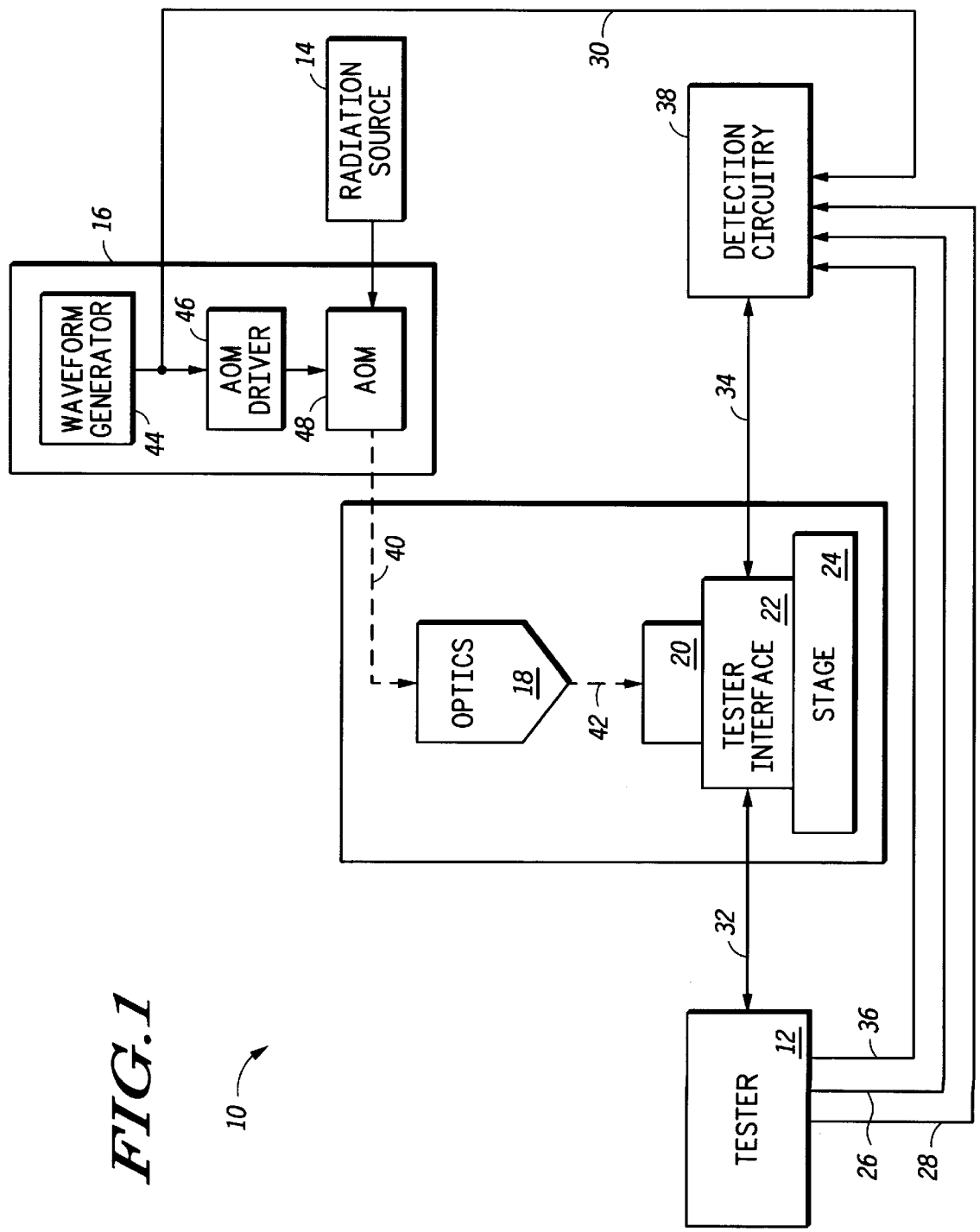
FIG. 1 illustrates a test system in accordance with one embodiment of the invention.

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DESCRIPTION OF A PREFERRED EMBODIMENT

Generally, the present invention involves a method for detecting electrical characteristics, such as voltage levels, within an integrated circuit (IC) by using an Amplitude Modulated Optical Beam Induced Current (AMOBIC). An AMOBIC signal is created when a PN junction is irradiated with a pulsed radiation beam, such as a pulsed laser beam. By using a pulsed radiation beam, as opposed to a DC or unpulsed laser used in the prior art, an OBIC signal is amplitude modulated (AM) to a carrier frequency. This carrier frequency is selected so that the AMOBIC signal is large when compared to the various noise sources. Thus, the AMOBIC signal can be more accurately detected and measured, as compared to the prior art OBIC signal. It should be appreciated that the carrier frequency may be chosen either above or below the operating frequency of the IC. In the case of higher frequency amplitude modulation, the carrier frequency should be chosen such that the electrical characteristic of the circuit node can be accurately reproduced. In the case of lower frequency amplitude modulation, a stroboscopic sampling technique can be employed. In addition, improved detection circuitry is used to reject noise injected into the signal by clock edge induced IDD transient current. Moreover, by using the noise rejection circuitry and the pulsed radiation beam, as described herein, ICs can be tested while they are operating at speeds on the order of many kilohertz (over two orders of magnitude greater than the prior art).

In addition, high current parts which consume hundreds of milliamperes can be tested with the present invention. Further, unlike the prior art which requires constant current, the present invention allows power fluctuations while ensuring that the VDD supplied to the IC is maintained within a functional operating range. The present invention also allows for analog voltage detection and not just digital (logic high and logic low) detection. Therefore, RC time constants, voltage stability over a period of time, voltage rise and fall times, and the like electrical characteristics can be found for internal nodes of an IC. With the present invention the pulsed radiation beam induces an AMOBIC signal while a kilo-hertz clock signal is applied to the IC, thereby allowing the dynamic operation of the IC and its circuit nodes to be observed in a manner beyond the capabilities of the prior art. In general, the present invention overcomes many of the limitations and disadvantages inherent in the prior art.

The invention can be further understood with reference to FIGS. 1–12.

Shown in FIG. 1 is a testing system 10 in accordance with one embodiment of the present invention. Test system 10 comprises a tester 12, a radiation source 14, a modulator 16, optics 18, a tester interface 22, a stage 24, and detection circuitry 38. In a preferred embodiment tester 12 is a commercially available tester such as a Hilevel tester, a Teradyne tester, a Hewlett Packard tester, an Advantest tester, or the like. Tester 12 provides functional test vectors, speed path test vectors, and/or the like test conditions to integrated circuit (IC) 20 of FIG. 1 (IC 20 is also referred to as a device under test {DUT}). Radiation source 14 is preferably an infrared laser such as an NdYAG laser. Alternatively, radiation source 14 may be a laser with a different wavelength, or another type of radiation source that can be focused into a spot size suitable for probing PN junctions. It should be appreciated that the radiation emitted from radiation source 14 should have an energy sufficient to allow it to penetrate a portion of the package and/or semiconducting substrate of IC 20 and create electron-hole pairs near a PN junction or circuit node within IC 20, which is to be tested. In one embodiment, radiation source 14 is a 300 milliwatt NdYAG laser.

In one embodiment, modulator 16 comprises a waveform generator 44, an acousto-optic modulator (AOM) driver 46, and an acousto-optic modulator (AOM) 48. Waveform generator 44 may be a square wave generator, a sinusoidal wave generator, or a pulse generator with variable pulse width and any duty cycle. Typically, waveform generator 44 generates any cyclic or non-cyclic waveform which can be used as a control signal to change or modulate radiation emitted from radiation source 14 to create pulsed radiation signal 40.

Acousto-optic modulator driver (AOMD) 46, and acousto-optic modulator (AOM) 48 are commercially available optic components and can be obtained from vendors such as, A.A. Opto-Elektronik GmbH. It should be appreciated that radiation source 14 and modulator 16 may be replaced with another pulsed radiation beam generating system, such as a pulsed laser, whereby the pulsed laser would directly provide pulsed radiation signal 40 as an output. During testing, waveform generator 44 delivers a modulation reference signal 30 to detection circuitry 38. Modulation reference signal 30 allows detection circuitry 38 to optimize noise rejection and signal detection, based upon the pulse frequency of pulsed radiation signal 40.

Optics 18 are commercially available optics for a laser scanning microscope and can be obtained from vendors such as Carl Zeiss Inc. Pulsed radiation signal 40 is focused by optics 18 to form a continuously pulsed radiation beam 42 which is then used to electrically perturb a selected PN junction within IC 20. Tester interface 22 is used for electrically coupling tester 12 to integrated circuit 20. Tester interface 22 is typically bidirectional, whereby tester 12 and tester interface 22 can send and receive electrical signals as both input and output. Stage 24 is a conventional motor control stage for a laser scanning microscope and can be obtained from vendors such as Carl Zeiss. Detection circuitry 38, which will be described in more detail later (see FIGS. 2–5), is bi-directionally coupled to tester interface 22 and is used to detect AMOBIC signal perturbations from an accessible terminal of IC 20.

During testing, integrated circuit 20 (device under test {DUT}) is mounted to tester interface 22. Tester 12 electrically stimulates integrated circuit 20 through tester interface 22 and signal line 32. At the same time, radiation emitted from radiation source 14 is chopped by acousto-optic modulator (AOM) 48 to produce pulsed radiation signal 40, which is then focused to form pulsed radiation beam 42. In a preferred embodiment laser light emitted by a NdYAG laser is chopped by AOM 48 to produce a pulsed laser light, which is subsequently focused to form a continuously pulsed infrared laser beam. It should be appreciated that other radiation sources that can also produce an OBIC response within IC 20 can be used in place of a NdYAG laser. By probing an internal circuit node or PN junction within IC 20 with pulsed radiation beam 42, the informational waveform or electrical signal generated in response to the probing is amplitude modulated (AM) onto a carrier at the pulsing frequency of pulsed radiation beam 42, wherein the pulsing frequency of pulsed radiation beam 42 is defined by modulator 16, as previously discussed. The advantage of this AM technique is that the informational waveform or electrical signal generated from probing the circuit node or PN junction is translated to a portion of the frequency spectrum that contains less noise such as ground, VDD, and switching noise. In general, AM frequency shifting is used to move the OBIC signal away from that part of the spectrum which is dominated by the switching noise of integrated circuit 20, and away from the common mode noise introduced by the test environment of FIG. 1, so that it can be more easily detected or measured.

In one embodiment, a selected PN junction within integrated circuit 20 is irradiated with pulsed radiation beam 42 to produce an amplitude modulated optical beam induced current (AMOBIC) within integrated circuit 20. An AMOBIC signal is then AM detected via detection circuitry 38, which is electrically coupled to a an accessible terminal of IC 20, such as an external power supply terminal. Detection circuitry 38 then amplifies, filters, and processes the signal to eliminate transient noise spikes at clock transition edges, etc., and then demodulates the AMOBIC signal. It is important to note that detection circuitry 38 allows the AMOBIC signal to be detected even in the presence of nominal IDD background current that is present when IC 20 is functionally clocked at a selected clocking frequency. It should be appreciated that the present invention allows integrated circuits requiring a power supply current in excess of 2 milliamperes to be tested, unlike the prior art. Moreover, the present invention also allows integrated circuits having power supply fluctuations in excess of 2 milliamperes to be tested. Signal processing of the AMOBIC signal is important because large current transients on the order of many milliamperes and IDD current level step changes on the order of hundreds of milliamperes effect the signal to noise (S/N) ratio at the input of the AM demodulator 60 of FIG. 2, and thus processing these noise contributions out of the monitored signal path increases detection sensitivity and measurement accuracy. An AMOBIC signal induced by pulsed radiation beam 42 is typically in the microampere range, and thus a low S/N ratio can limit the sensitivity of the present invention.

During testing, tester 12 is programmed to assert a clock transient elimination control signal 26 that is used in conjunction with detection electronics 38 to attenuate the clock related IDD transients within the AMOBIC signal and also any large current level step changes that occur while IC 20 is operating or functionally clocked. It should be appreciated that the AMOBIC signal can also be monitored by detection circuitry 38 for a high derivative/slope or high magnitude current pulse which can then trigger or initiate self-decimation of the signal noise. In addition, all clock transitions during a single tester cycle (each vector) can be grouped together so that any IDD transients and current level step changes occur during a small portion of the total tester cycle. This grouping of transitions is desirable since the attenuation of the clock switching "noise" has a trade-off of losing measurement ability for a brief moment while the attenuation circuit is activated. The grouping thereby would minimize the time in which the clock switching "noise" is processed out during the tester cycle and maximize the sampling or waveform measurement time during the remainder of the cycle while still maintaining adequate noise rejection. As previously mentioned, it should be appreciated that the transient clock elimination control signal 26 can also be produced from the transient IDD spikes themselves. Thus, the present invention allows IC 20 to undergo AMOBIC testing while it is functionally clocked at a selected clocking frequency. For example, integrated circuits have been tested while being functionally clocked at frequencies of 100 Hz, 1000 Hz, and 25 KHz. It is important to appreciate the present invention may also be used for clocking frequencies lower than 100 Hz and for clocking frequencies greater than 25 KHz. For example, integrated circuits operating at clocking frequency of 50 Hz or of 250 KHz may be tested with the present invention.

Tester 12 is also programmed to produce a trigger signal 28 for the oscilloscope 62, which is within detection circuitry 38 (also see trigger signal 28 of FIG. 2) and is used to monitor the AMOBIC signal. Tester 12 also supplies power to integrated circuit 20 through detection circuitry 38 via signal line 36 and signal line 34. During testing, waveform generator 44 delivers a modulation reference signal 30 to detection circuitry 38. In general, the system of FIG. 1 uses pulsed radiation beam 42 along with clock edge signal attenuation circuits within detection circuitry 38 (see FIG. 4) to allow for the detection of an AMOBIC signal from IC 20 when IC 20 consumes large currents and is operating in a kilo-hertz frequency range. Analog voltage waveform detection can be accomplished since pulsed radiation beam 42 can be used to sample the dynamic operation of a circuit node or PN junction within IC 20 multiple times during a single state.

Figure 2:
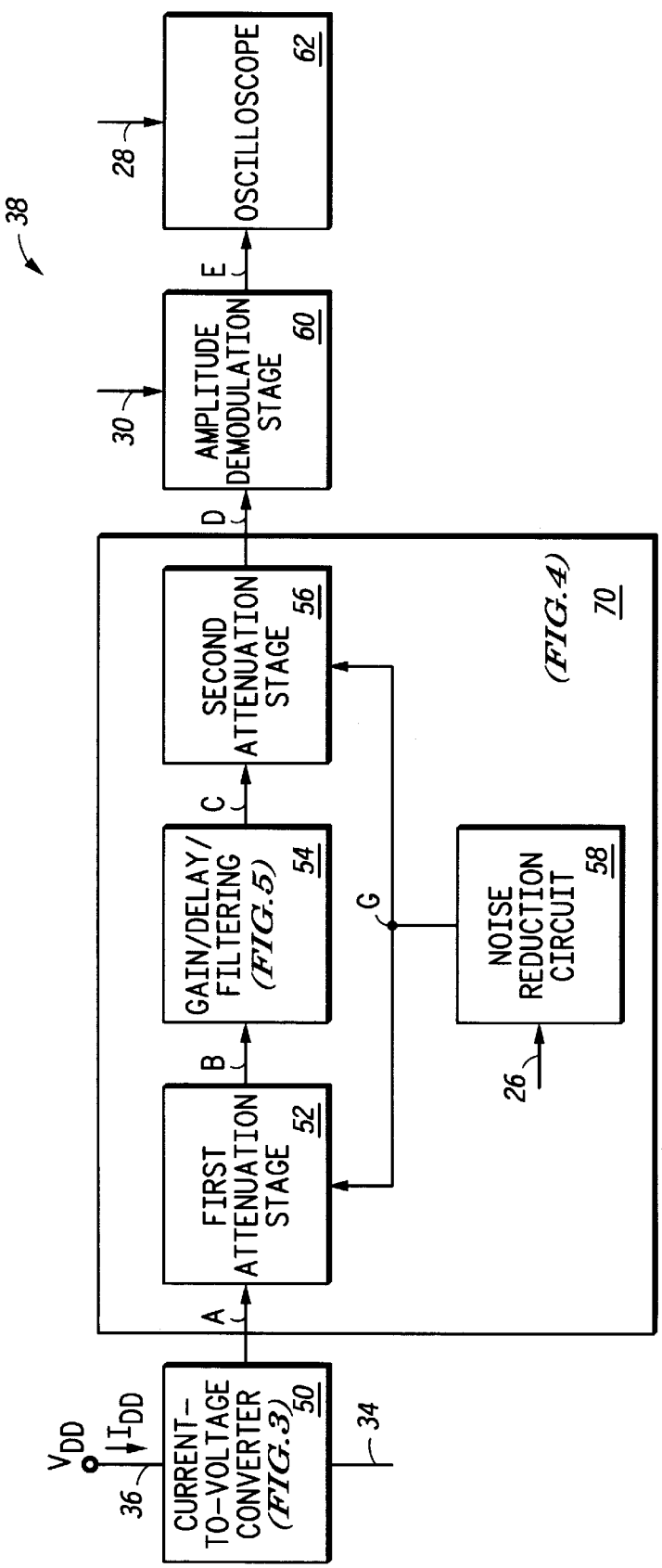
FIG. 2 illustrates, in block diagram form, detection circuitry in accordance with one embodiment of the invention.

Shown in FIG. 2, in block diagram form, is detection circuitry 38 in accordance with one embodiment of the invention. Detection circuitry 38 comprises a current-to-voltage converter 50, an amplitude demodulation stage 60, an oscilloscope 62, and a clock transient elimination circuit 70. Clock transient elimination circuit 70 comprises a first attenuation stage 52, a gain/delay/filtering stage 54, a second attenuation stage 56, and an injected noise reduction circuit 58. Clock transient elimination circuit 70 performs the clock edge noise attenuation discussed above with reference to FIG. 1. As shown in FIG. 2, VDD power supply line 36 and IC 20 supply line 34 are coupled to current-to-voltage converter 50. First attenuation stage 52 of circuit 70 is coupled to current-to-voltage converter 50 via circuit node A. First attenuation stage 52 is coupled to gain/delay/filtering stage 54 via circuit node B and coupled to noise reduction circuit 58 via circuit node G. Gain/delay/filtering stage 54 is coupled to second attenuation stage 56 via circuit node C. In addition, second attenuation stage 56 is coupled to noise reduction circuit 58 via circuit node G and to amplitude demodulation stage 60 via circuit node D. Amplitude demodulation stage 60 is then coupled to oscilloscope 62 via circuit node E. Amplitude demodulation stage 60 is a commercially available lock-in amplifier which amplifies and filters the signal prior to demodulation. A lock-in amplifier can be obtained from vendors such as EG&G PARC. It should be appreciated that the demodulation can be performed using other amplitude demodulation methods. The nodes A–G will be useful when subsequently illustrating in FIG. 10 the various electrical waveforms resident at certain nodes within detection circuitry 38. Transient clock elimination control signal 26 is coupled to noise reduction circuit 58. Modulation reference signal 30 is coupled to demodulation stage 60, and trigger signal 28 is coupled to oscilloscope 62. It should be appreciated that detection circuitry 38 allows for the detection of an AMOBIC signal among milliamperes of noise.

Figure 3:
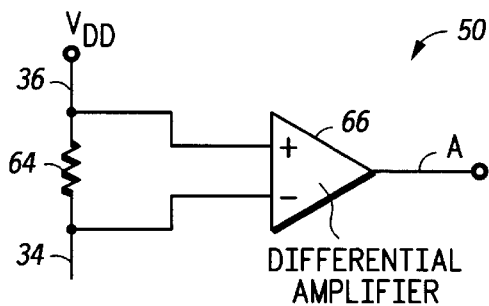
FIG. 3 illustrates a current-to-voltage converter in accordance with one embodiment of the invention.

Shown in FIG. 3 is a specific current-to-voltage converter 50 in accordance with one embodiment of the invention. In this embodiment, current-to-voltage converter 50 comprises a resistor 64 and a front-end differential amplifier 66. As shown in FIG. 3, resistor 64 is placed in series with VDD power supply line 36 and IC 20 supply line 34 (this assumes that the VDD terminal is the external terminal of IC 20 which is being used for AMOBIC detection or measurement). The voltage differential developed across resistor 64 (VDD 36–VDD34) is amplified by differential amplifier 66 to generate an output voltage at node A. Any voltage differential developed across resistor 64 (VDD 36–VDD34) in response to the generation of an AMOBIC signal within IC 20 is amplified by detection circuitry 38 along with some noise present within IC 20. In one embodiment, resistor 64 has a resistance of 1 ohm and differential amplifier 66 is an amplifier provided by Analog Devices, model number SSM-2017, and has a gain of 50.

Alternatively, it should be appreciated that front-end amplifier 66 may be AC coupled to VDD power supply line 36 and IC 20 supply line 34, instead of being DC coupled as shown in FIG. 3. In addition, it should also be appreciated that front-end differential amplifier 66 should have high common mode rejection because of the common mode noise generated by tester 12. Front-end differential amplifier 66 provides the common mode rejection, converts the differential signal to a single-ended signal referenced to ground, and amplifies the signal to a desired level for further processing. It is important to note that resistor 64 should be small, on the order of 10 Ω or less, to prevent intolerable degradation of the power supplied to integrated circuit 20 during switching transients. The DC voltage drop across resistor 64 can be accounted for by raising the voltage supplied by tester 12. Finally it should be noted that integrated circuit 20 should be tested with little or no external decoupling capacitance because this decoupling capacitance would unacceptably attenuate the IDD perturbation at the desired pulsing frequency thereby making the AMOBIC signal more difficult to detect with accuracy. Therefore, FIG. 3 illustrates one way in which AMOBIC signal can be translated to a voltage signal for proper signal processing within detection circuitry 38.

Figure 4:
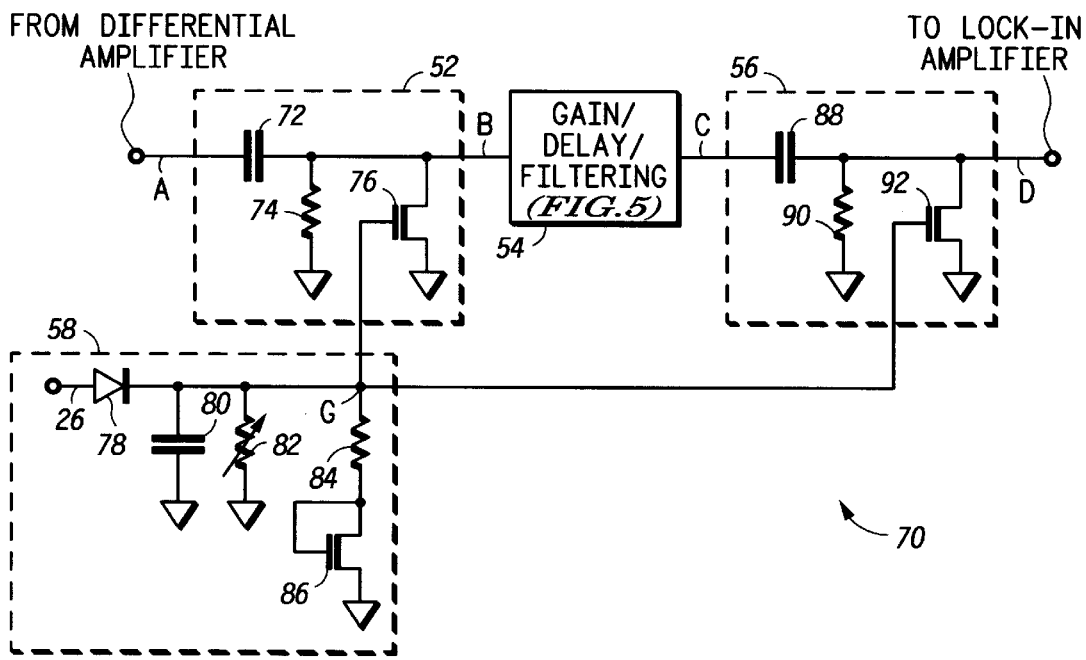
FIG. 4 illustrates a clock transient elimination circuit in accordance with one embodiment of the invention.
Figure 5:
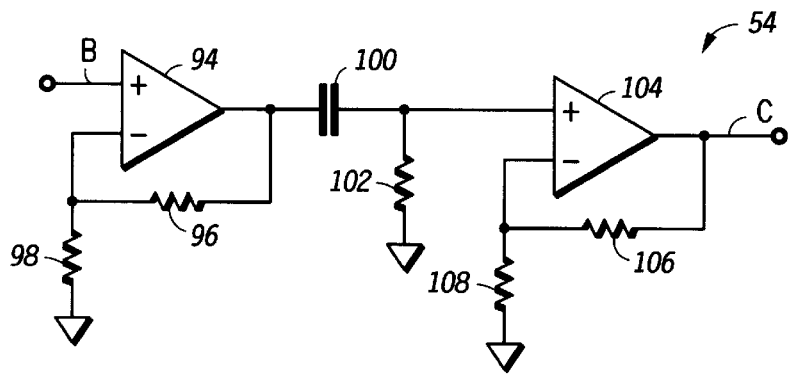
FIG. 5 illustrates, in circuit schematic form, a gain/delay/filtering stage in accordance with one embodiment of the invention.

Shown in FIG. 4 is a clock transient elimination circuit 70 in accordance with one embodiment of the invention. As previously discussed, clock transient elimination circuit 70 comprises a first attenuation stage 52, a gain/delay/filtering stage 54 (see FIG. 5), a second attenuation stage 56 and noise reduction circuit 58. First attenuation stage 52 comprises a capacitor 72, a resistor 74, and a NMOS transistor 76. In one embodiment, capacitor 72 has a capacitance of 68 pF and resistor 74 has a resistance of 2200 ohms. Noise reduction circuit 58 comprises a diode 78, a capacitor 80, a variable resistor 82, a resistor 84, and an NMOS transistor 86. In one embodiment, capacitor 80 has a capacitance of 620 pF, and variable resistor 82 and resistor 84 have a resistance of 110 kohms and 475 ohms, respectively. Similar to first attenuation stage 52, second attenuation stage 56 comprises a capacitor 88, a resistor 90, and a NMOS transistor 92. In one embodiment, capacitor 88 has a capacitance of 68 pF and resistor 90 has a resistance of 2200 ohms. A first plate of capacitor 72 is coupled to node A and a second plate of capacitor 72 is coupled to circuit node B, a first terminal of resistor 74, and to the drain of NMOS transistor 76. Nodes A, B, etc. are also illustrated in FIG. 2. The second terminal of resistor 74 and the source of NMOS transistor 76 are coupled to ground (GND). The input to diode 78 is coupled to the clock transient elimination signal 26. The output of diode 78 is coupled to the gate electrode of NMOS transistor 76, the gate electrode of NMOS transistor 92 via node G, a first plate of capacitor 80, a first terminal of variable resistor 82, and to a first terminal of resistor 84. The second terminal of resistor 84 is coupled to the drain of NMOS transistor 86, which is in turn coupled to the gate of NMOS transistor 86. The second plate of capacitor 80, the second terminal of variable resistor 82 and the source of NMOS transistor 86 are coupled to ground. The input to gain/delay/filtering stage 54, which will be described in more detail in FIG. 5, is coupled to circuit node B and the output of gain/delay/filtering stage 54 is coupled to circuit node C. A first plate of capacitor 88 is coupled to circuit node C and the second plate of capacitor 88 is coupled to circuit node D, a first terminal of resistor 90, and to the drain of NMOS transistor 92. The second terminal of resistor 90 and the source of NMOS transistor 92 are coupled to ground.

Clock transient elimination circuit 70 attenuates the clock induced IDD transients and machine state induced IDD step changes occurring at the clock edges so that noise is removed and the AMOBIC signal can be detected. If these noise sources are not eliminated, then the resulting S/N ratio may be too low to produce a usable signal.

As shown in FIG. 4, the first attenuation stage 52 consists of a high pass filter with a cut-off frequency that is controlled by transient clock elimination control signal 26. When first attenuation stage 52 is disabled in response to transient clock elimination control signal 26 being disabled or not asserted, then transistor 76 is off. When transistor 76 is off, the RC time constant created by capacitor 72 and resistor 74 produces a high pass filter with a cut-off frequency of f1. When transient clock elimination control signal 26 is enabled or asserted, transistor 76 is turned on and the RC time constant of the high pass filter is changed since the resistance is reduced due to the parallel combination of transistor 76 and resistor 74. This change in resistance results in the high pass filter 52 being shifted to a cut-off frequency of f2, wherein f2>f1. Transient clock elimination control signal 26 is set to be active for a short "window" or time period around the clock edge of a clock signal used to operate integrated circuit 20 (which is the device under test {DUT} in FIG. 1).

As described previously, the test vectors output from the tester 12 can be modified so that all clock transitions occur during a small portion (less than 1 μs) of the total tester cycle (approximately 40 μs). With knowledge of the timing of the clock edge induced IDD transients and the machine state induced IDD step changes, a signal can be generated by tester 12 to enable the attenuation of these unwanted "noise" components and thereby improve the S/N ratio for improved AM signal detection. The overall S/N ratio is improved at the cost of losing some information for a very brief period of time while the attenuation circuits 52 and 56 are in an active state. An attempt is made to limit this attenuation "dead time" to as small a portion of the clock cycle as possible so that maximal signal sampling or observation is obtained for every clock cycle. It should be appreciated that unlike the prior art, which can only sample the signal once per clock cycle, the present invention allows the signal to be sampled more than once (a plurality of times) per clock cycle.

The combination of resistor 74 and capacitor 72 in FIG. 4 are chosen such that the frequency of the radiation induced IDD signal perturbations pass with minimal attenuation, i.e. the cutoff frequency f1 of the deactivated attenuation circuit is less than the chopping/pulsing frequency generated by modulator 16 and radiation source 14 of FIG. 1. When the attenuation circuit is activated, the circuit cut-off frequency f1 is shifted to a much higher frequency f2 controlled by the on resistance of NMOS transistor 76 combined with the capacitance of capacitor 72. This arrangement gives several advantages. First, the RC time constant of the filter is very small when the circuit is activated making transients decay very quickly. Second, the attenuation is frequency dependent which provides enhanced low frequency attenuation as compared to a purely resistive circuit. Finally, the signal is AC coupled to gain/delay/filtering stage 54 and is referenced to ground. An important consideration is that the gate signal of NMOS transistor 76 is capacitively coupled onto node B through the gate to drain capacitance of NMOS transistor 76 which results in unwanted noise being injected onto node B. Reduction of this unwanted injected noise is discussed in the following section via use of the subsequently-encountered second attenuation stage 56 and noise reduction circuit 58.

After first attenuation stage 52, the unwanted IDD transients and step changes have been sufficiently attenuated. However, the noise injected by first attenuation stage 52, particularly at the leading edge of the transient clock elimination control signal 26, is still large when compared to the signal on node B. Therefore, second attenuation stage 56, which consists of a high pass filter similar to that discussed in reference to first attenuation stage 52, is used to attenuate the noise injected by first attenuation stage 52 after the signal on node B has been amplified to a desired level by gain/delay/filtering stage 54 (see FIG. 5). Second attenuation stage 56 functions in a manner similar to that previously described for first attenuation stage 52.

Noise reduction circuit 58 is used to control the operation of first attenuation stage 52, such that noise injection onto node B is minimized during the falling edge of clock transient elimination signal 26. More specifically, it is important to control the way NMOS transistor 76 turns off as first attenuation stage 52 is deactivated. As NMOS transistor 76 turns off, the attenuation of node B is greatly reduced allowing the falling edge of the gate signal on NMOS transistor 76 to couple to node B through gate to drain capacitance. To reduce this unwanted coupling to node B, the rate of change (dv/dt) of the gate signal has to be reduced when NMOS transistor 76 is near its threshold voltage ($V_t$=2 V). At the same time, NMOS transistor 76 must be turned off quickly to insure a small amount of attenuation "dead time".

A feature of noise reduction circuit 58 is that the falling edge of transient clock elimination control signal 26 is capacitively coupled to the gate of NMOS transistor 76 through the capacitive divider formed by diode 78 and capacitor 80. The value of capacitor 80 is chosen such that the gate signal of NMOS transistor 76 is rapidly lowered to within a small delta of the NMOS transistor 76 threshold voltage $V_t$ (referred to as Capacitive Coupling 300 in FIG. 11). Since diode 78 is now reversed biased at this voltage, the remaining fall of the NMOS transistor 76 gate signal is controlled by the subcircuit made up of resistor 84, variable resistor 82, capacitor 80, and NMOS transistor 86, now isolated by the reverse biasing of diode 78. It is this subcircuit which contains resistor 84, variable resistor 82, capacitor 80, and NMOS transistor 86 which discharges node G in a controlled manner. A qualitative description of the operation of this subcircuit within noise reduction circuit 58 follows.

Figure 11:
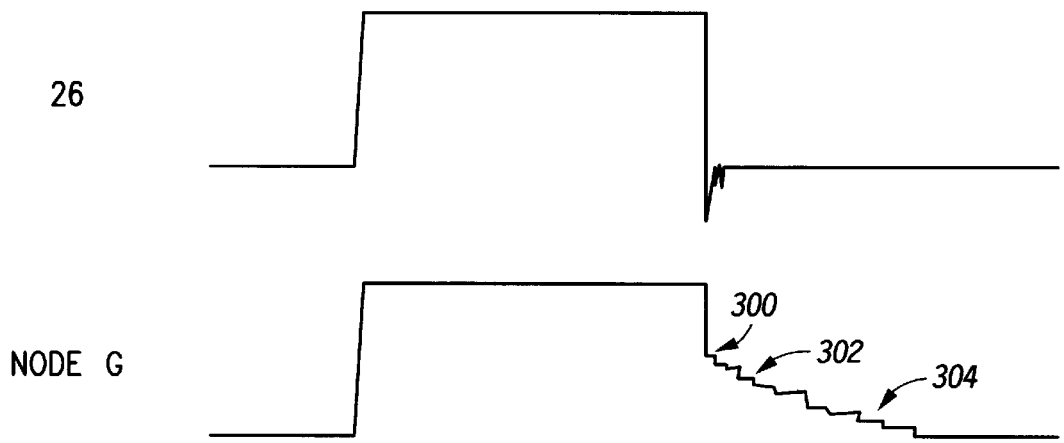
FIG. 11 illustrates voltage waveforms from node 26 and node G within detection circuitry 38.

Near the end of an attenuation cycle, the time constant of the noise reduction circuit 58 is determined by resistor 84 and capacitor 80 since the on resistance of NMOS transistor 86 is small and the value of variable resistor 82 is large (referred to as Fast RC discharge 302 in FIG. 11). As the gate voltage of NMOS transistor 76 approaches the threshold voltage $V_t$, the resistance of both NMOS transistor 76 and NMOS transistor 86 increases. The dv/dt of the gate signal on NMOS transistor 76 will thus be reduced because the time constant of the biasing circuit will begin to be controlled by the off resistance of NMOS transistor 86 and the capacitance of capacitor 80. Although the susceptibility of the information signal path to injected noise is increased as the NMOS transistor 76 resistance increases, the amount of noise actually injected is reduced by minimizing the dv/dt on the gate of NMOS transistor 76 (see Slow RC discharge 304 of FIG. 11). When the threshold voltage is reached, both NMOS transistor 76 and NMOS transistor 86 turn completely off. To ensure that NMOS transistor 76 is completely turned off so that the node B is no longer attenuated, variable resistor 82, which has a large resistance to produce a large RC product) provides a low current discharge path to bring the gate signal of NMOS transistor 76 below the transistor threshold voltage. Variable resistor 82 may be realized with a large potentiometer that allows a slight adjustment to trade circuit "dead time" against the amount of injected noise as an engineer requires such changes. Once an optimal point is found, the potentiometer or variable resistor 82 may be replaced by a fixed resistor if so desired. It should be appreciated that attenuation of node B may also be achieved using other noise reduction circuits which perform similar noise attenuation operations.

Shown in FIG. 5 is a circuit schematic for gain/delay/filtering stage 54 in accordance with one embodiment of the invention. Gain/delay/filtering stage 54 comprises an operational amplifier 94, a resistor 98, a resistor 96, a capacitor 100, a resistor 102, an operational amplifier 104, a resistor 106, and a resistor 108. Gain/delay/filtering stage 54 provides the various beneficial functions discussed below. Stage 54 provides a high input impedance buffer, amplifies the signal on node B, filters the incoming signal from node B, and delays the injection of noise from first attenuation stage 52 which allows the attenuation of the injected noise to be controlled by transient clock elimination control signal 26.

In one embodiment operational amplifier 94 is an Analog Devices model AD842 amplifier having a gain equal to 101, and operational amplifier 104 is an Analog Devices model AD842 amplifier having a gain equal to 11. Capacitor 100 has a capacitance of 68 pf and resistors 96, 98, 102, 106, and 108 have resistance's of 2000 ohms, 20 ohms, 2200 ohms, 1000 ohms, and 100 ohms respectively. It should be noted that many other resistor, capacitor, gain, and op-amp configuration and sets may be used herein to obtain a similar result. In another form, stage 54 need only perform one of filtering, delay or gain to serve a useful purpose in the overall design.

Figure 6:
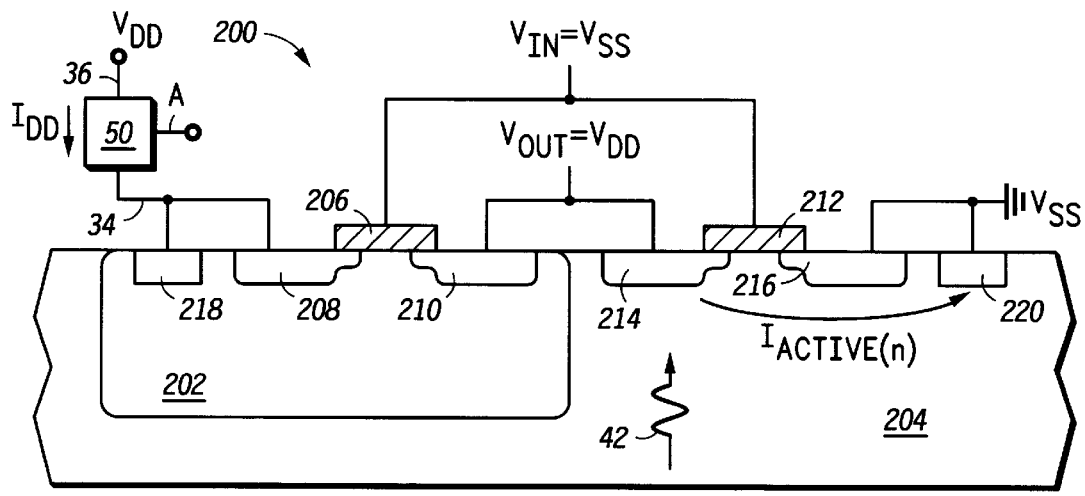
FIG. 6 illustrates, in cross-section, a portion of an integrated circuit under testing in accordance with one embodiment of the invention.

Shown in FIG. 6 is a simplified cross-sectional view of an inverter 200 within IC 20, wherein the voltage input node (VIN) of inverter 200 is held at VSS or ground and the resultant voltage output node (VOUT) of inverter 200 is at VDD.

Figure 7:
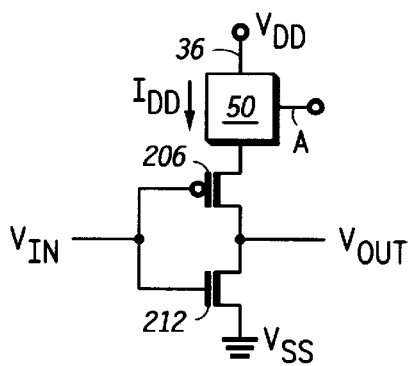
FIG. 7 illustrates, in schematic form, the electrical circuit for the integrated circuit under test in FIG. 6.

Shown in FIG. 7 is a circuit schematic corresponding to inverter 200, wherein inverter 200 is in a high logic output state and is undergoing testing in accordance with the present invention.

In order to determine the logic state of inverter 200 using the present invention, the PN junction comprising the N+ drain region 214 and P-type substrate 204 is irradiated with pulsed radiation beam 42. This irradiation by pulsed radiation beam 42 generates an amplitude modulated optical beam induced current (AMOBIC), with a polarity such that the AMOBIC flows from the N+ drain region 214, through the P-type substrate 204, to the P+ substrate contact 220. This AMOBIC signal is labeled Iactive(n) in FIG. 6. With the biasing conditions shown in FIG. 6, the P-channel transistor comprised of gate 206, drain 210, source 208 and N-well 202 is in a low impedance state. Therefore, a low impedance path exists through this P-channel transistor such that the AMOBIC signal Iactive(n) can be sensed through the VDD terminal 34 by the current-to-voltage converter 50.

Figure 8:
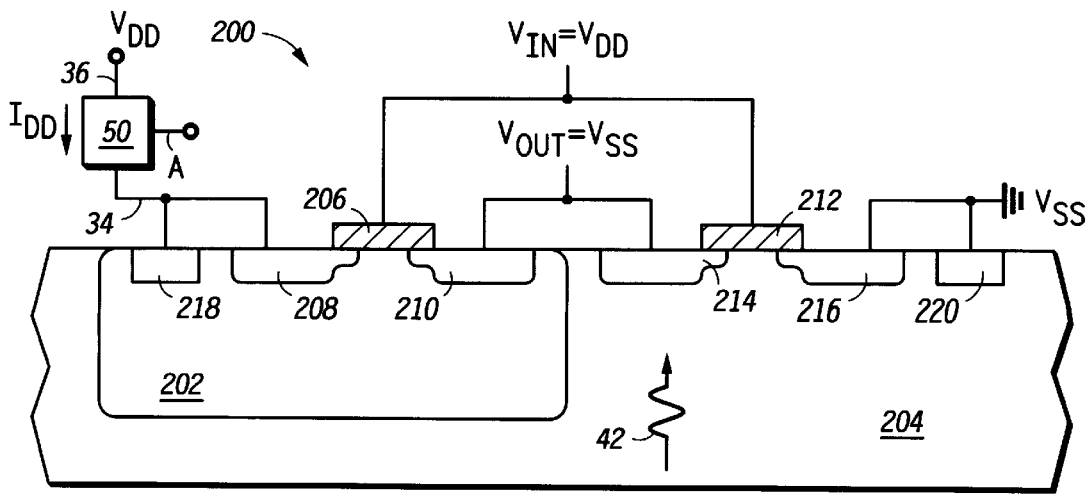
FIG. 8 illustrates, in cross-section, a portion of an integrated circuit under testing in accordance with another embodiment of the invention.

Shown in FIG. 8 is a simplified cross-sectional view of an inverter 200 within IC 20, wherein the voltage input node (VIN) of inverter 200 is held at VDD and the resultant voltage output node (VOUT) of inverter 200 is at VSS or ground.

Figure 9:
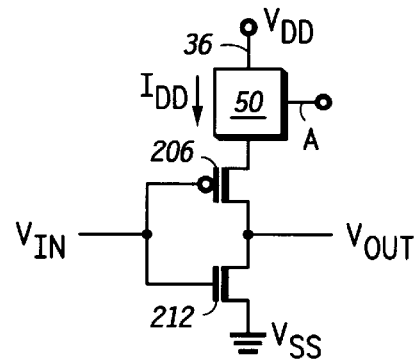
FIG. 9 illustrates, in schematic form, the electrical circuit for the integrated circuit under test in FIG. 8.

Shown in FIG. 9 is a circuit schematic corresponding to inverter 200, wherein inverter 200 is in a low logic output state and is undergoing testing in accordance with the present invention.

In order to determine the logic state of inverter 200 using the present invention, the PN junction comprising the N+ drain region 214 and P-type substrate 204 is again irradiated with pulsed radiation beam 42. This irradiation by pulsed radiation beam 42 generates an amplitude modulated optical beam induced current (AMOBIC), with a polarity such that the AMOBIC flows from the N+ drain region 214, through the P-type substrate 204, to the P+ substrate contact 220. This AMOBIC signal is referred to as Iactive(n) in the previous discussion of FIG. 6. However, under the biasing conditions shown in FIG. 8, the P-channel transistor comprised of gate 206, drain 210, source 208 and N-well 202 is in a high impedance state. Therefore, a high impedance path exists through this P-channel transistor which prevents the AMOBIC signal Iactive(n) from being sensed through the VDD terminal 34 by the current-to-voltage converter 50. The generated AMOBIC signal Iactive(n) is instead shunted through an internal current loop provided by the low impedance path of the N-channel transistor comprised of gate 212, drain 214, source 216 and P-type substrate 204.

It is important to note that pulsed radiation beam 42 also generates a parasitic AMOBIC signal (Iwell) because of lateral diffusion and collection of generated electron-hole pairs at the junction between N-well 202 and P-type substrate 204. This Iwell signal does not contain logic state information. In this example a description of logic state determination has been given, but this technique is not limited to logic state analysis. It should be appreciated that the analog voltage level of the output can also be determined from the AMOBIC signal.

In summary, using the present invention, the logic state at the output of inverter 200 can be determined by the magnitude of the Iactive(n) AMOBIC signal sensed through the VDD terminal 34. It should be appreciated that logic states can also be determined by irradiating the PN junction comprising the P+ drain region 210 and N-well 202 with pulsed radiation beam 42. In addition it should be appreciated that the AMOBIC signal Iactive(n) can be sensed through the VSS terminal with a current-to-voltage converter placed in series between IC 20 and the VSS or ground supply terminal. However, caution should be taken in order to ensure that the VSS or ground sensing technique does not cause the VSS or ground signal supplied to IC 20 to be elevated to a voltage level which interferes with the functionality of IC 20.

From the above discussions of FIGS. 6–9, the total IDD for IC 20 can thus be expressed with the following simplified equation when the pulsed radiation beam 42 irradiates a PN junction comprising the N+ drain region 214 and P-type substrate 204 within IC 20:

$$IDD = IDDq + IDDt + Iwell + Iactive(n)$$

Under normal operating conditions IDDq is the nominal quiescent current of IC 20 and IDDt is a transient current occurring at clock transients or clock edges within IC 20. Typical IDDq and IDDt values can both be on the order of 100 milliamperes. However, the Iactive(n) AMOBIC signal generated from a PN junction region irradiated by pulsed radiation beam 42 is typically on the order of 1 microampere. The present invention provides the ability to measure the magnitude of the Iactive(n) in the presence of IDDq and IDDt background currents which are typically larger by five orders of magnitude. It should be appreciated that by using a plurality of pulsed radiation beams a plurality of circuit nodes may be tested simultaneously with the present invention.

FIG. 10 illustrates a set of signal waveforms as they would appear at various stages of the system in FIG. 2. Specifically, FIG. 10 illustrates a time versus voltage plot of the signal at each node A–G of FIG. 2. FIG. 10 illustrates the voltage signal at node A which is output from the circuit of FIG. 3. This waveform for node A is the raw AMOBIC signal and current noise transformed to a voltage signal via the circuitry of FIG. 3.

FIG. 10 illustrates the time versus voltage plot of node B in FIG. 2. As clearly shown in the waveform for node B in FIG. 10, the IDD transient current spikes of Node A are filtered as taught herein. However, the node C waveform of FIG. 10 illustrates the noise injected into the signal by noise reduction circuit 58 of FIGS. 2 and 4. As discussed previously, this injected noise is removed by the second attenuation stage 56 as illustrated in the waveform for node D illustrated in FIG. 10.

FIG. 10 next illustrates the signal at node D amplified by a factor of thirty. As can be seen from this magnified signal, noise has been substantially removed from the system whereby the AMOBIC signal created by pulsed radiation beam 42 is left behind. A lock-in amplifier and averaging scheme is then used to demodulate the signal as illustrated via the node E waveform of FIG. 10. The averaging scheme results in a waveform that shows an analog voltage which is a function of the amplitude of the AMOBIC signal. This waveform E can also be used to determine RC time delays and like analog voltage values on a PN junction as time progresses in FIG. 10.

FIG. 10 also illustrates the transient clock elimination control signal 26 which is used to control noise reduction circuit 58 of FIGS. 2 and 4, and the signal G which is RC discharge controlled by noise reduction circuit 58.

FIG. 11 illustrates a magnified view of the bottom two signals of FIG. 10. Therefore, FIG. 11 illustrated the transient clock elimination control signal 26 and the signal on node G from FIG. 4. The variable RC discharge delay of Node G, which is provided for by the resistors, capacitors, and transistors within noise reduction circuit 58 and discussed previously, is illustrated in FIG. 11. This discharge delay reduces the amount of injected noise in detection circuitry 38 of FIG. 2.

Figure 12:
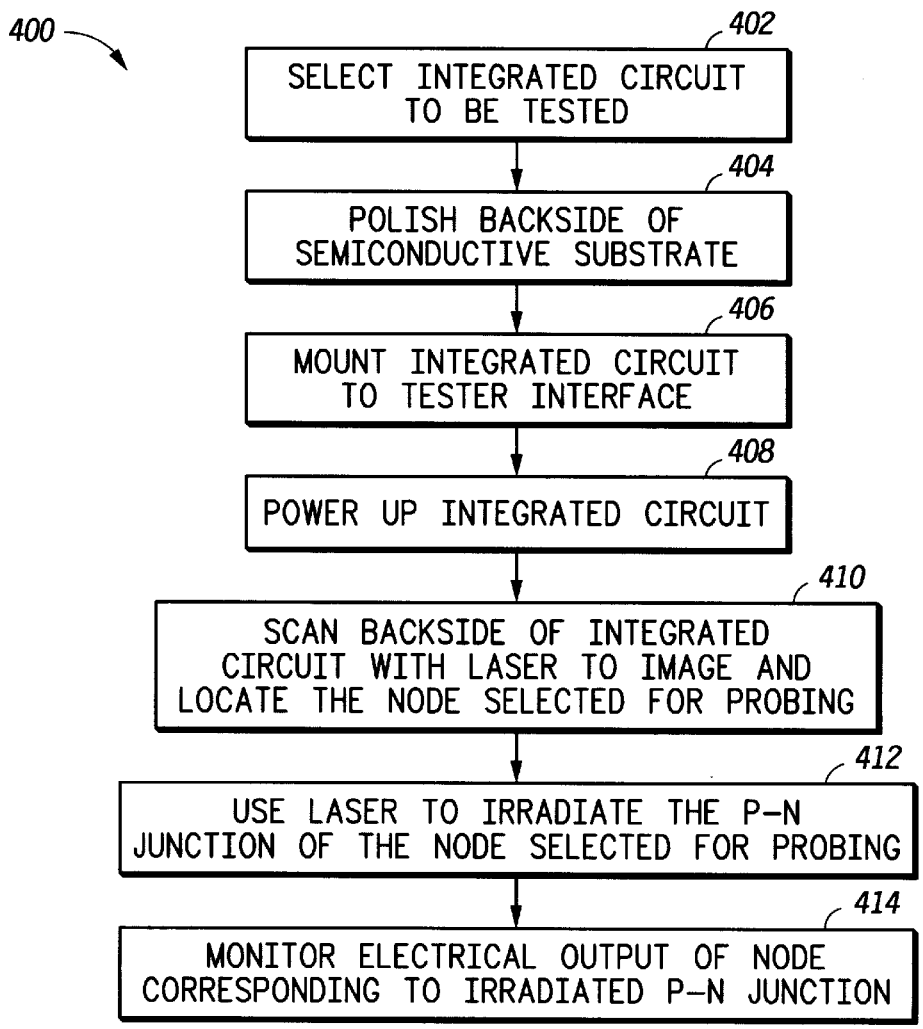
FIG. 12 illustrates, in flow diagram form, a process flow for testing an integrated circuit in accordance with one embodiment of the invention.

Shown in FIG. 12 is a flow diagram 400 which illustrates a method for testing a circuit in accordance with one embodiment of the invention. In step 402, an integrated circuit in a Ball Grid Array (BGA) package is selected for testing. In step 404, the back surface of the integrated circuit's semiconductive substrate is then polished or thinned using conventional techniques. Polishing reduces the light scattering of the back surface and allows pulsed radiation beam 42 to maintain a small spot size when probing a selected PN junction or circuit node within the integrated circuit. In addition, thinning of the integrated circuit's semiconductive substrate also allows pulsed radiation beam 42 to effectively reach PN junctions within the integrated circuit. It should be appreciated that the back surface of the integrated circuit's semiconductive substrate may be polished or thinned either before or after the integrated circuit has been packaged. In one embodiment, the thickness of the semiconductive substrate is thinned/polished to have a final thickness ranging from approximately 55 to 150 microns. It should also be appreciated that the integrated circuit may be fabricated with a semiconductive substrate which has a thickness and back surface properties which makes polishing and thinning of the semiconductive substrate optional. In step 406, the integrated circuit is mounted to tester interface 22. In step 408, power is supplied to the integrated circuit. In step 410, a portion of the back surface of integrated circuit 20 is then scanned with infrared light to generate a first circuit image. This first circuit image is then compared to the actual circuit layout for the integrated circuit in order to achieve a gross locational correlation between circuit nodes on the integrated circuit and circuit nodes on the actual circuit layout. Once this gross calibration is accomplished, the area or location containing a circuit node selected to be tested is again scanned with infra-red light in order to generate a second circuit image. The second circuit image is then compared to the actual circuit layout to achieve a one to one correlation between circuit nodes on the integrated circuit and circuit nodes on the actual circuit layout. Thus, this allows a specific circuit node on the integrated circuit which corresponds to the same circuit node on the actual circuit layout, to be located and selected for testing. In step 412, after a circuit node has been selected for testing the PN junction for that node is then irradiated with pulsed radiation beam 42 which results in the generation of an AMOBIC signal. In step 414, an electrical characteristic of the selected circuit node is then monitored in response to its PN junction being irradiated by pulsed radiation beam 42. In one embodiment the external power terminal of the integrated circuit is monitored to detect the AMOBIC signal. It should be appreciated that the monitored electrical characteristic may be a voltage level, voltage instability over a selected time period, a voltage rise time, a voltage fall time, a logic state, logic state transitions, a current, a capacitance, a resistance, or the like, or a combination thereof. Moreover, it should be appreciated that with the present invention the electrical characteristics of a selected circuit node can be sampled several times per clock cycle, unlike the prior art which can only sample the electrical characteristics of a given circuit node once per clock cycle.

Furthermore, it should be appreciated that the present invention can be used to detect a defect within an integrated circuit, and a mask change or process change can be subsequently made so that integrated circuits which are fabricated after the mask change or process change are fabricated without the defect. For example, in one embodiment a first integrated circuit is fabricated using a first mask. A defect is then detected in the first integrated circuit using AMOBIC testing as described herein. Subsequent integrated circuits are then fabricated with a second mask, wherein the second mask corrects the defect found in the first integrated circuit, and thus these integrated circuits are fabricated without the defect. Similarly, in another embodiment, a first integrated circuit is fabricated using a first fabrication process. A defect is then detected in the first integrated circuit using AMOBIC testing as described herein. Subsequent integrated circuits are then fabricated with a second fabrication process, wherein the second fabrication process corrects the defect found in the first integrated circuit, and these integrated circuits are fabricated without the defect. It should be appreciated that the defect detected by AMOBIC testing may be a circuit node with an improper logic state, a circuit node which has a voltage instability, a circuit node with an improper voltage rise time, a circuit node with an improper voltage fall time, a circuit node which does not transition between a first logic state and a second logic state (stuck at fault defect), or the like. As discussed above these defects are then corrected by changing a fabrication mask or a fabrication process. For example, a fabrication process may be changed to decrease the resistance of a given interconnect line or an implant dose may be altered to change the threshold voltage of a given transistor. Similarly, a mask may be changed to decrease the resistance of a given contact between two different level of interconnect or to reduce the gate length of a given transistor. Thus, the present invention may also be used to fabricate integrated circuits having improved yield and performance.

Thus it is apparent that there has been provided, in accordance with the present invention, an amplitude modulated OBIC technique using a pulsed radiation beam and improved noise rejection. This technique can be used to test dynamic operation of ICs at higher frequencies than previously possible. Higher current and higher power devices can also be tested using the technique taught herein. In addition, the technique taught herein can be used to fabricate integrated circuits having improved yield and performance. Although the invention has been described and illustrated with reference to the specific embodiment, it is not intended that the invention be limited to these illustrative embodiments. Those skilled in the art will recognize that modifications and variations may be made without departing from the spirit and scope of the invention. Therefore, it is intended that this invention encompass all variations and modifications as fall within the scope of the appended claims.

What is claimed is:

1. A method for determining an electrical characteristic of a node within a circuit comprising the steps of:

providing the circuit;

determining a location of the node within the circuit;

irradiating the location of the node with a pulsed radiation beam to induce an amplitude modulated optical beam induced current (AMOBIC) within the circuit, the pulsed radiation beam having a pulse frequency; and using the amplitude modulated optical beam induced current (AMOBIC) to determine the electrical characteristic of the node.

2. The method of claim 1, wherein the step of providing the circuit is further characterized as providing an integrated circuit.

3. The method of claim 2, further comprising the step of monitoring a signal on an accessible terminal of the integrated circuit, wherein the accessible terminal is affected by the amplitude modulated optical beam induced current (AMOBIC).

4. The method of claim 3, wherein the step of monitoring the signal, the accessible terminal is further characterized as a power supply terminal.

5. The method of claim 4, wherein the step of monitoring the signal a current of greater than 20 milliamperes flows through the power supply terminal at least one point in time.

6. The method of claim 4, wherein the step of monitoring the signal a current of greater than 200 milliamperes flows through the power supply terminal at least one point in time.

7. The method of claim 3, wherein the step of monitoring the signal comprises the step of attenuating a portion of the signal.

8. The method of claim 7, wherein the step of attenuating the portion of the signal is further characterized as using a high pass filter to attenuate a portion of the signal.

9. The method of claim 3, wherein the step of monitoring the signal, the accessible terminal undergoes a current level change at a clock transition edge, wherein the current level change is greater than 10 milliamperes.

10. The method of claim 3, wherein the step of monitoring the signal, the accessible terminal undergoes a current level change at a clock transition edge, wherein the current level change is greater than 100 milliamperes.

11. The method of claim 3, wherein the step of monitoring the signal, the accessible terminal undergoes a current transient spike at a clock transition edge, wherein the current transient spike is greater than 200 milliamperes.

12. The method of claim 3, wherein the step of monitoring the signal comprises the step of attenuating the signal within a time period coinciding with a clock transition edge.

13. The method of claim 1, wherein the step of providing the circuit is further characterized as providing an integrated circuit in a ball grid array (BGA) package.

14. The method of claim 1, wherein the step of determining the location of the node comprises the step of scanning a portion of the circuit with infra-red light.

15. The method of claim 1, wherein the step of irradiating the location of the node is further characterized as irradiating the location of the node with a pulsed laser beam.

16. The method of claim 15, wherein step of irradiating the location of the node is further characterized as irradiating the location of the node with a pulsed infra-red laser beam.

17. The method of claim 1, wherein the step of irradiating the location of the node, the electrical characteristic is further characterized as a logic state.

18. The method of claim 1, wherein the step of irradiating the location of the node, the electrical characteristic is further characterized as a voltage.

19. The method of claim 1, further comprising the step of operating the circuit at a selected clocking frequency while the location of the node is being irradiated.

20. The method of claim 19, wherein the step of operating the circuit, the selected clocking frequency is greater than 100 Hz.

21. The method of claim 19, wherein the step of operating the circuit, the selected clocking frequency is greater than 1000 Hz.

22. The method of claim 19, wherein the step of operating the circuit, the selected clocking frequency is greater than 25 KHz.

23. The method of claim 19, wherein the step of irradiating the location of the node, the pulse frequency is less than the selected clocking frequency.

24. The method of claim 1, wherein the node is further characterized as an output node of an inverter.

25. The method of claim 1, wherein the step of irradiating the location of the node, the electrical characteristic is further characterized as a voltage rise time.

26. The method of claim 1, wherein the step of irradiating the location of the node, the electrical characteristic is further characterized as a voltage fall time.

27. A method for determining a logic state of a node within a circuit comprising the steps of:

providing the circuit;

providing a power supply current to the circuit;

providing a clock signal at a frequency greater than 1000 Hz to the circuit, the circuit operating continuously in response to the clock signal, the clock signal having clock edges and a clock cycle;

irradiating the node within the circuit with a pulsed radiation beam while the circuit is operating to induce an amplitude modulated optical beam induced current (AMOBIC) within the circuit; and using the amplitude modulated optical beam induced current (AMOBIC) to determine the logic state of the node.

28. The method of claim 27, wherein the step of providing the circuit is further characterized as providing an integrated circuit.

29. The method of claim 28, wherein the step of providing the integrated circuit is further characterized as providing an integrated circuit that requires a current in excess of 20 milliamperes.

30. The method of claim 28, wherein the step of providing the power supply current is further characterized as providing a power supply current which fluctuates in magnitude in excess of 20 milliamperes.

31. The method of claim 28, wherein the step of providing a clock signal is further characterized as providing a clock signal at a frequency greater than or equal to 10 KHz.

32. The method of claim 27, wherein the step of irradiating the node is further characterized as irradiating the node with a pulsed laser beam to induce the amplitude modulated optical beam induced current (AMOBIC) within the circuit.

33. The method of claim 32, further comprising the step of monitoring a signal on an accessible terminal of the circuit, wherein the accessible terminal is affected by the amplitude modulated optical beam induced current (AMOBIC), the signal being attenuated during time periods that coincide with the clock edges of the clock signal.

34. The method of claim 27, wherein the step of irradiating is further characterized as irradiating the node with a pulsed infra-red laser beam.

* * * * *